US012137531B2

United States Patent
Tsorng et al.

(10) Patent No.: US 12,137,531 B2
(45) Date of Patent: Nov. 5, 2024

(54) ASSEMBLY FOR SECURING REMOVABLE MODULE

(71) Applicant: Quanta Computer Inc., Taoyuan (TW)

(72) Inventors: Yaw-Tzorng Tsorng, Taoyuan (TW); Hung-Wei Chen, Taoyuan (TW); Ming-Lung Wang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 165 days.

(21) Appl. No.: 18/082,751

(22) Filed: Dec. 16, 2022

(65) Prior Publication Data

US 2024/0155799 A1    May 9, 2024

Related U.S. Application Data

(60) Provisional application No. 63/382,983, filed on Nov. 9, 2022.

(51) Int. Cl.
*H05K 7/14*    (2006.01)
(52) U.S. Cl.
CPC .................. *H05K 7/1489* (2013.01)
(58) Field of Classification Search
None
See application file for complete search history.

(56) References Cited

U.S. PATENT DOCUMENTS

| 10,840,643 | B1* | 11/2020 | Jin | H01R 12/722 |
| 2013/0176690 | A1* | 7/2013 | Sun | H05K 5/023 |
| | | | | 361/747 |
| 2015/0131227 | A1* | 5/2015 | Howell | G06F 1/185 |
| | | | | 211/26 |
| 2021/0153373 | A1* | 5/2021 | Chen | H05K 7/02 |

FOREIGN PATENT DOCUMENTS

CN    112817383 B    9/2022

OTHER PUBLICATIONS

TW Office Action for Application No. 112113198, mailed Oct. 16, 2023, w/ First Office Action Summary, 7 pp.

* cited by examiner

*Primary Examiner* — James Wu
*Assistant Examiner* — Christopher L Augustin
(74) *Attorney, Agent, or Firm* — NIXON PEABODY LLP

(57) ABSTRACT

An assembly for securing an electrical component to a server is disclosed. The assembly includes a structural case configured to receive and secure in place an electrical component for the server; a pair of rail holders mounted to the structural case, each rail holder of the pair of rail holders having a plurality of mounting holes that includes a first hole and a second hole; and a pair of latches, each latch of the pair of latches being movably mounted to a respective one of the pair of rail holders, each latch having a finger end that is coupled to a hook end via a bridge portion. The finger end and the hook end are inserted, respectively, into the first hole and the second hole of the respective one of the pair of rail holder, and independently and flexibly move relative to the bridge portion in response to applied pressure.

20 Claims, 8 Drawing Sheets

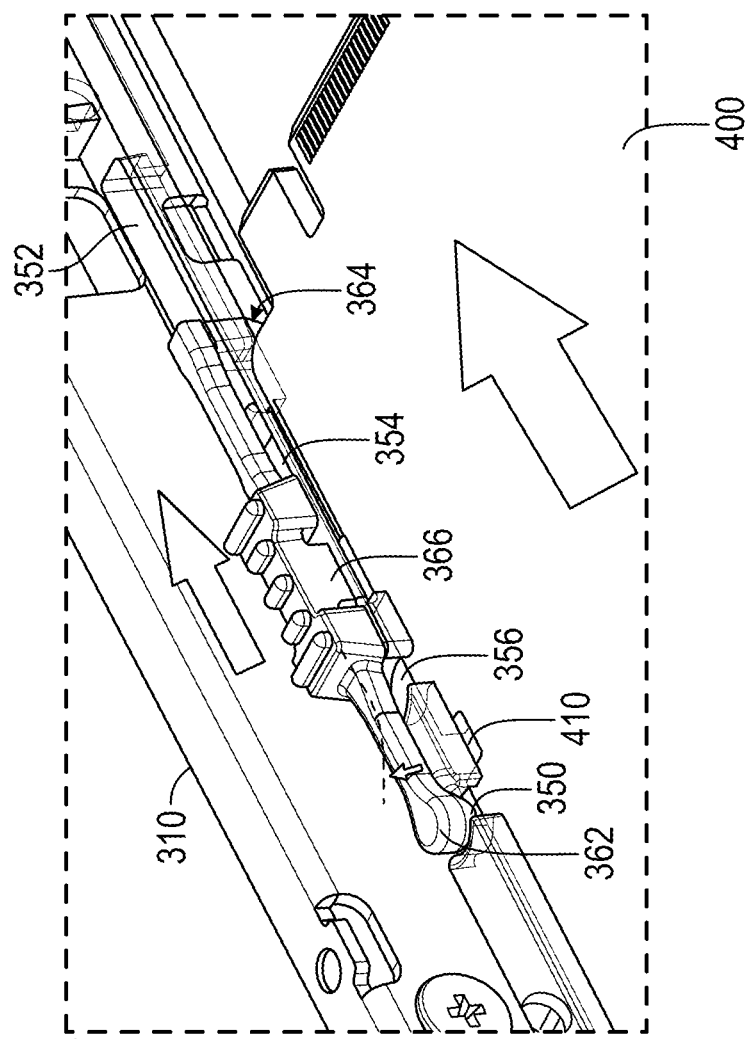
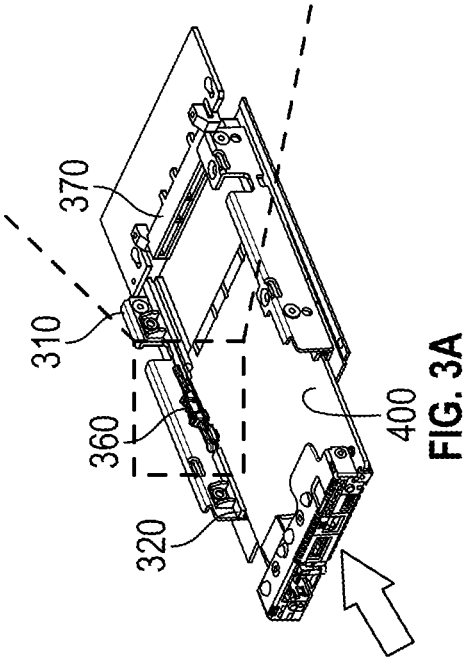
FIG. 3B
FIG. 3A

ASSEMBLY FOR SECURING REMOVABLE MODULE

CROSS-REFERENCE TO RELATED APPLICATIONS

This application claims priority from and benefit of U.S. Provisional Patent Application Ser. No. 63/382,983, filed on Nov. 9, 2022, titled "MECHANISMS FOR REMOVABLE MODULE," which is hereby incorporated by reference herein in its entirety.

FIELD OF THE INVENTION

The present invention relates generally to an assembly for securing an electrical component to a server, and more specifically, to a secure/release mechanism for a removable module.

BACKGROUND OF THE INVENTION

Servers are specialized computer systems that include numerous electrical components integrated into a single unit using a server chassis. Common to all servers is some form of a motherboard including a central processing unit (CPU), slots for memory (e.g., DDR3, DDR4, DRAM), PCIe (Peripheral Computer Interconnect Express) slots, and connectors to other components, such as hard drives, a power supply, and peripherals (e.g., USB ports, LAN and other I/O ports).

A number of electrical components or modules, such as Open Compute Project (OCP) and secure control module (SCM), are installed in a server. FIGS. 1A and 1B show a prior art assembly 100 for securing a module or electrical component 200 to a server. Referring to FIGS. 1A and 1B, conventionally, the module or electrical component 200 is installed in a structural case 110 of the assembly 100 by being inserted into and advanced inward along a rail structure 120 attached to the structural case 110. The module 200 advanced all the way inward along the rail structure 120 is eventually held by a motherboard connector 170, as shown in FIG. 1B.

However, the motherboard connector 170 alone is not sufficient to secure the inserted module 200 stably. For example, the module 200 may be released from the connector 170 accidentally in response to an impact. Therefore, in general, the module 200 is fixed to the structural case 110 by a fastening mechanism such as a screw, requiring use of a tool, to avoid such an accidental release. For example, a through hole 140 is formed on the rail structure 120 to receive a screw, the screw passing through the through hole 140 being engaged with a receiving portion formed on the module 200. Further, to remove the module 200 from the structural case 110, the screw needs to be released from the receiving portion of the module 200 and the through hole 140 of the rail structure 120 by using the tool. The module 200 can be removed from the structural case 110 by being pulled out of the rail structure 120 only after the screw is unscrewed.

Therefore, a need exists for a mechanism to more easily secure the module installed in the server without requiring use of a tool. A need also exists for easier removal of the installed module from the server without requiring use of a tool.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

In view of the above-described problem with the conventional holder or mechanism for securing an electrical component for a server, the present application discloses a holder with a mechanism for securing or removing an electrical component for a server more easily without requiring use of a tool.

According to certain aspects of the present disclosure, an assembly for securing an electrical component to a server is disclosed. According to various embodiments, the assembly includes a structural case for a server, the case being configured to receive and secure in place an electrical component for the server. The assembly further includes a pair of rail holders mounted to the structural case, respectively, near a respective case side of two opposing case sides. Each rail holder of the pair of rail holders has a plurality of mounting holes that includes a first hole and a second hole. The assembly further includes a pair of latches, each latch of the pair of latches being movably mounted to a respective one of the pair of rail holders. Each latch has a finger end that is coupled to a hook end via a bridge portion, the finger end and the hook end being inserted, respectively, into the first hole and the second hole of the respective one of the pair of rail holder. The finger end and the hook end independently and flexibly move relative to the bridge portion in response to applied pressure.

For example, the applied pressure is an installation pressure caused by contact between the electrical component and, sequentially, the finger end and the hook end, the installation pressure being applied when the electrical component is advanced towards a secured position relative to the structural case. For example, the applied pressure is a disassembly pressure caused by an operator, without use of tools, in response to pressing the bridge portion, the disassembly pressure being applied when the electrical component is removed from the secured position. For example, the pair of latches is made of an elastic material comprising plastic, rubber, or hybrid material having elastic properties.

According to another aspect of the assembly, each rail holder further includes a third hole into which the bridge portion is inserted. In some embodiments, the third hole is positioned between the first hole and the second hole. In some embodiments, each rail holder further includes a fourth hole positioned between the first hole and the third hole.

According to another aspect of the assembly, the finger end is placed in the first hole when no electrical component is received in the structural case. In some embodiments, the finger end is released from the first hole and subsequently inserted into the fourth hole in response to installation pressure or when the electrical component is advanced towards the secured position.

According to another aspect of the assembly, the second hole is elongated such that the hook end is movable within the second hole in response to at least the installation pressure or disassembly pressure. In some embodiments, the hook end moves from a first position to a second position within the second hole in response to the installation pressure or when the electrical component is advanced towards the secured position.

According to another aspect of the assembly, at least a portion of the electrical component at one side, which is perpendicular to opposite sides of the electrical component inserted into the pair of rail holders, is inserted into a connector at the structural case when the electrical component is advanced to the secured position.

According to another aspect of the assembly, the hook end is inserted into a hole formed on the electrical component to secure the electrical component to the structural case in response to the installation pressure or when the electrical component is advanced to the secured position. In some embodiments, the finger end is released from the fourth hole in response to the disassembly pressure or when the electrical component is removed from the secured position. In some embodiments, the released finger end is inserted into the first hole in response to the disassembly pressure or when the electrical component is removed from the secured position and pulled out of the rail holders.

According to another aspect of the assembly, the hook end is released from the hole formed on the electrical component when the electrical component is removed from the secured position and pulled out of the rail holders. In some embodiments, the hook end moves from a second position to a first position within the second hole when the electrical component is removed from the secured position and pulled out of the rail holders According to other aspects of the present disclosure, a server is enclosed. According to various embodiments, the server includes a structural case configured to receive and secure in place an electrical component and a pair of rail holders mounted to the structural case, respectively, near a respective case side of two opposing case sides. Each rail holder of the pair of rail holders has a plurality of mounting holes that includes a first hole and a second hole. The server further includes a pair of latches made of an elastic material comprising plastic, rubber, or hybrid material having elastic properties. Each latch of the pair of latches is movably mounted to a respective one of the pair of rail holders, each latch having a finger end that is coupled to a hook end via a bridge portion. The finger end and the hook end are inserted, respectively, into the first hole and the second hole of the respective one of the pair of rail holder. The finger end and the hook end independently and flexibly move relative to the bridge portion in response to applied pressure.

For example, the applied pressure is an installation pressure caused by contact between the electrical component and, sequentially, the finger end and the hook end, the installation pressure being applied when the electrical component is advanced towards a secured position relative to the structural case. For example, the applied pressure is a disassembly pressure caused by an operator, without use of tools, in response to pressing the bridge portion, the disassembly pressure being applied to remove the electrical component from the secured position.

According to another aspect of the server described above, each rail holder further includes a third hole into which the bridge portion is inserted, the third hole being positioned between the first hole and the second hole. According to another aspect of the server described above, the rail holder further includes a fourth hole positioned between the first hole and the third hole.

According to another aspect of the server described above, the finger end is placed in the first hole when no electrical component is received in the structural case. According to another aspect of the server described above, the finger end is released from the first hole and subsequently inserted into the fourth hole in response to installation pressure or when the electrical component is advanced towards the secured position. According to another aspect of the server described above, the hook end moves from a first position to a second position within the second hole in response to the installation pressure or when the electrical component is advanced towards the secured position.

According to another aspect of the server described above, at least a portion of the electrical component at one side, which is perpendicular to opposite sides of the electrical component inserted into the pair of rail holders, is inserted into a connector at the structural case when the electrical component is advanced to the secured position. According to another aspect of the server described above, the hook end is inserted into a hole formed on the electrical component to secure the electrical component to the structural case in response to the installation pressure or when the electrical component is advanced to the secured position.

According to another aspect of the server described above, the finger end is released from the fourth hole in response to the disassembly pressure or when the electrical component is removed from the secured position. According to another aspect of the server described above, the released finger end is inserted into the first hole in response to the disassembly pressure or when the electrical component is removed from the secured position and pulled out of the rail holders.

According to another aspect of the server described above, the hook end is released from the hole formed on the electrical component when the electrical component is removed from the secured position and pulled out of the rail holders. According to another aspect of the server described above, the hook end moves from the second position to the first position within the second hole when the electrical component is removed from the secured position and pulled out of the rail holders.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

FIG. 3A is a perspective view of an assembly for securing an electrical component to a structural case for a server, according to certain aspects of the present disclosure.

FIG. 3B is a magnified view of a portion of the assembly shown in FIG. 3A, according to certain aspects of the present disclosure.

Figure 1A:
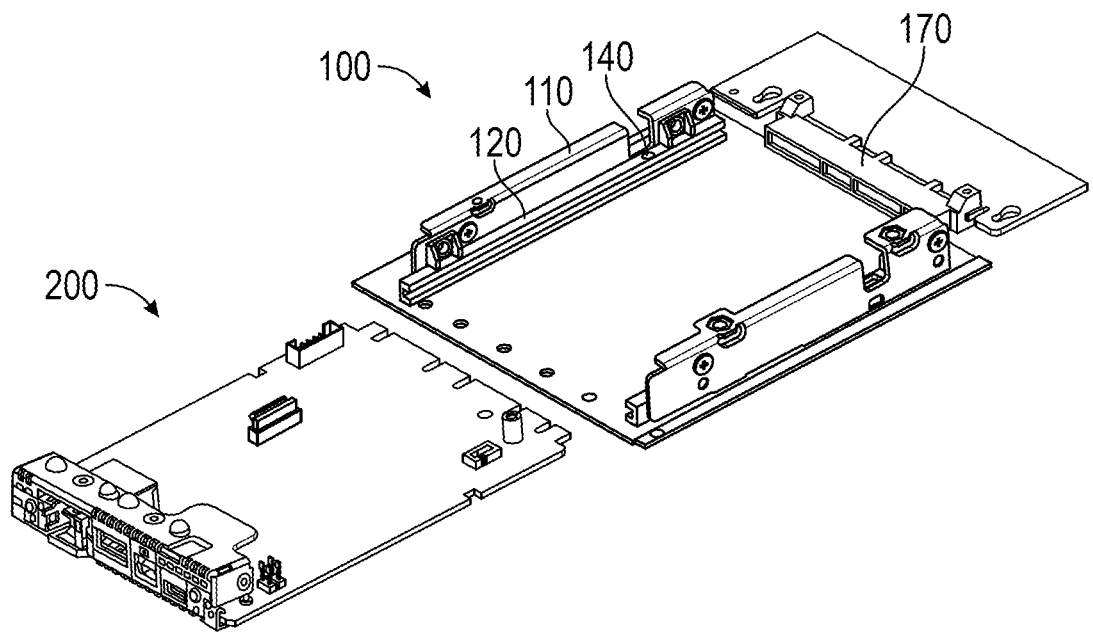
FIG. 1A is a perspective view of a prior art assembly for securing an electrical component to a structural case for a server.
Figure 1B:
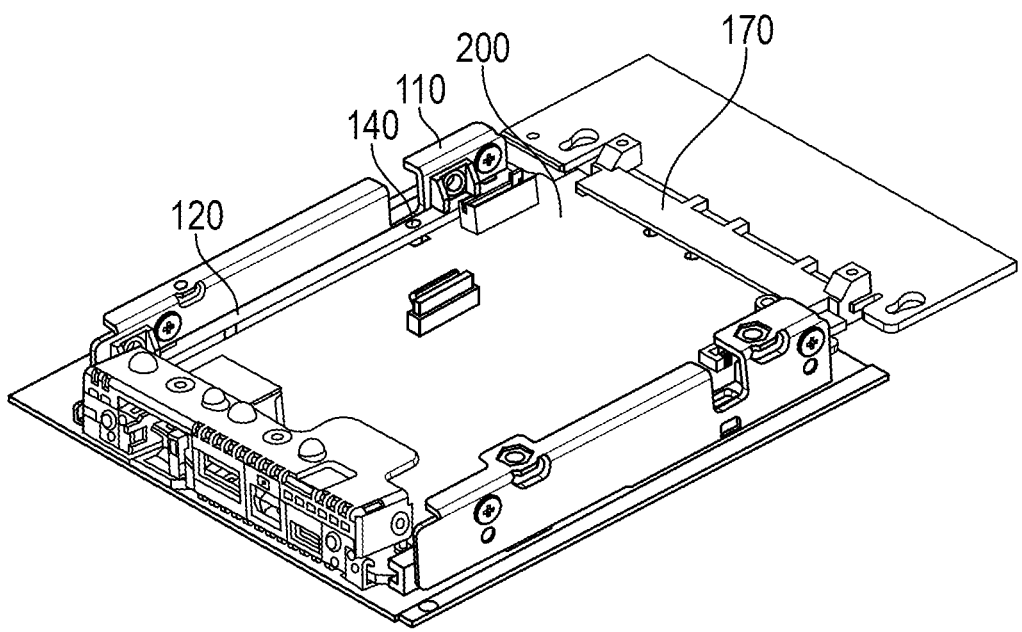
FIG. 1B is a perspective view of the prior art assembly shown in FIG. 1A, with the electrical component secured to the case.

Elements in the figures are illustrated for simplicity and clarity and have not necessarily been drawn to scale. For example, the dimensions and/or relative positioning of some of the elements in the figures may be exaggerated relative to other elements to help improve understanding of various features.

While the present disclosure is susceptible to various modifications and alternative forms, specific implementations have been shown by way of example in the drawings and will be described in further detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 2A:
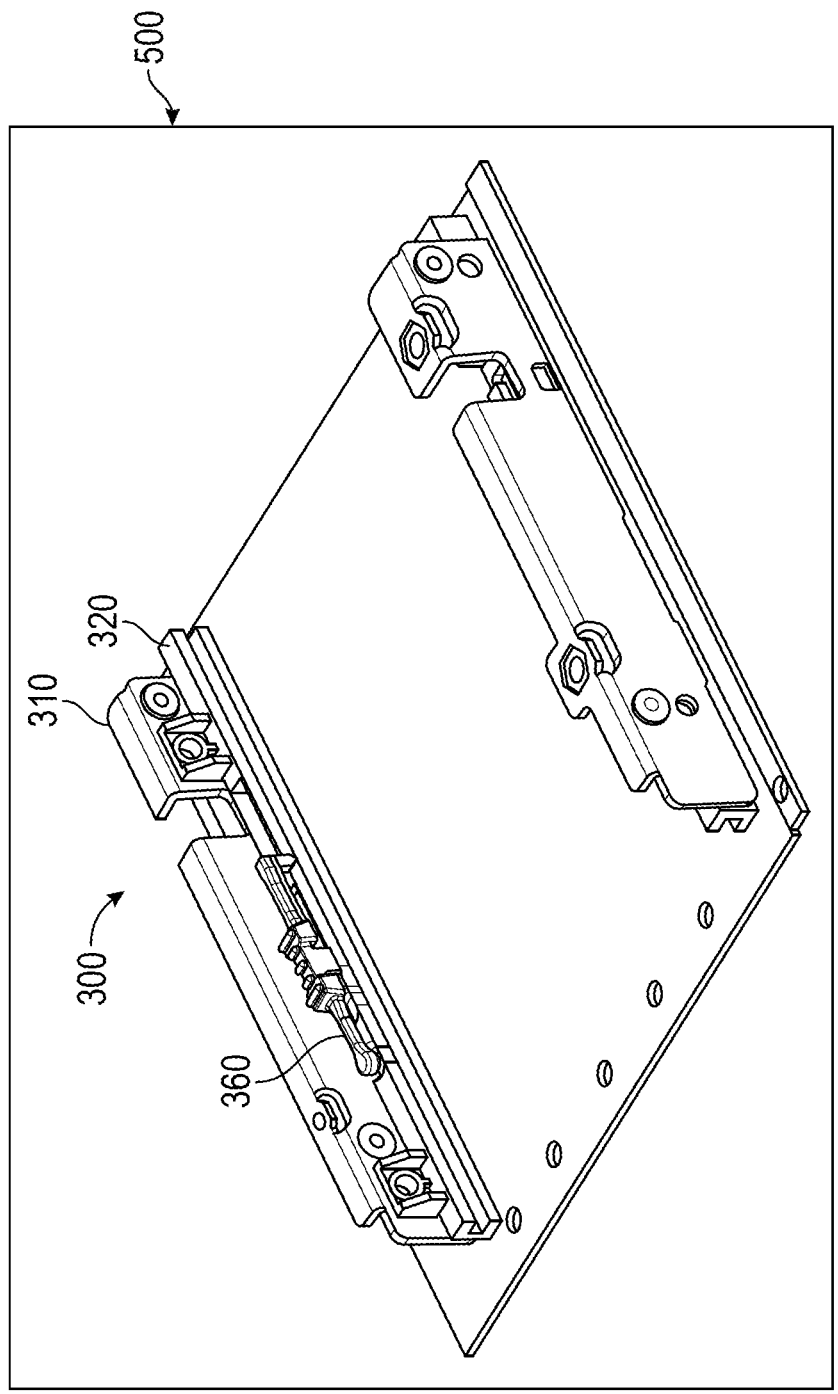
FIG. 2A is a perspective view of an assembly for securing an electrical component to a structural case for a server, according to certain aspects of the present disclosure.
Figure 2B:
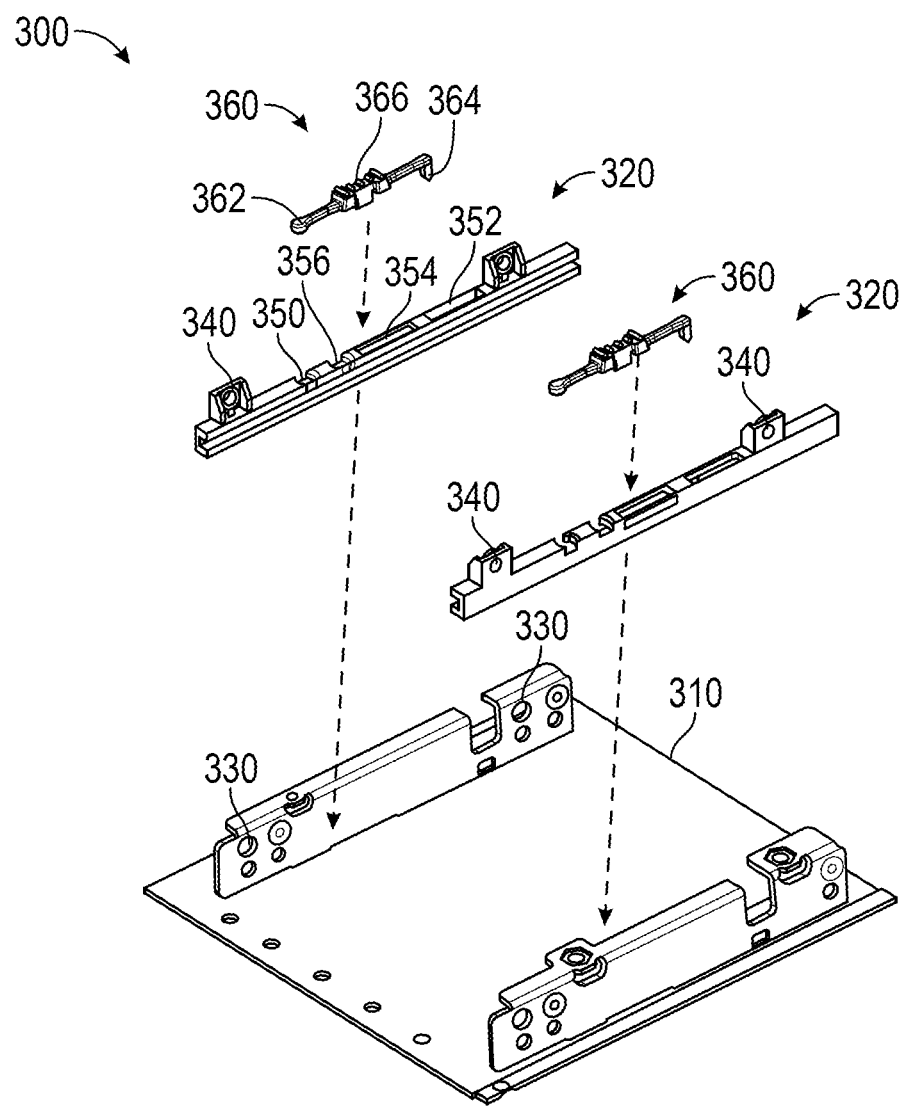
FIG. 2B is an exploded view of the assembly shown in FIG. 2A, according to certain aspects of the present disclosure.

An assembly for securing an electrical component to a server according to various embodiments of the present invention is shown in FIGS. 2A and 2B. The assembly 300 includes a structural case 310 for a server 500. The structural case 310 is configured to receive and secure in place an electrical component 400 for the server 500.

According to various embodiments of the present invention, the assembly 300 further includes a pair of rail holders 320 mounted to the structural case 310. In particular, the pair of rail holders 320 is mounted, respectively, near a respective case side of two opposing case sides. In some embodiments, the pair of rail holders 320 is mounted to the structural case 310 by a fastening mechanism such as a screw passing through holes 330, 340 formed on the rail holders 320 and structural case 310, respectively. The fastening mechanism is not limited thereto, and the mounting may be achieved by other fastening mechanisms including rivets, bolts, and/or nuts. In some embodiments, each rail holder 320 of the pair of rail holders has a plurality of mounting holes that includes a first hole 350 and a second hole 352, as shown in FIG. 2B.

Referring to FIGS. 2A and 2B, the assembly 300 further includes a pair of latches 360. For example, the pair of latches 360 is made of an elastic material comprising plastic, rubber, or hybrid material having elastic properties. Each latch 360 of the pair of latches is movably mounted to a respective one of the pair of rail holders 320. Each latch 360 has a finger end 362 that is coupled to a hook end 364 via a bridge portion 366. The finger end 362 and the hook end 364 are inserted, respectively, into the first hole 350 and the second hole 352 of the respective one of the pair of rail holder 320.

In some embodiments, the first hole 350 is sized such that the finger end 362 fits in the first hole 350. In some embodiments, the finger end 362 cannot move within the first hole 350. In some embodiments, the second hole 352 is formed as a through-hole.

The finger end 362 and the hook end 364 are configured to independently and flexibly move relative to the bridge portion 366 in response to applied pressure. The movement of the finger end 362 and hook end 364 are due to elasticity of the latch 360 that can be deformed in response to the pressure. For example, the applied pressure is an installation pressure caused by contact between the electrical component 400 and, sequentially, the finger end 362 and the hook end 364. In various embodiments, the installation pressure is applied when the electrical component is installed or advanced towards a secured position relative to the structural case 310.

In another example, the applied pressure is a disassembly pressure caused by an operator, without use of tools, in response to pressing the bridge portion 366. For example, the disassembly pressure is applied to release the electrical component 400 from the structural case 310 or when the electrical component 400 is removed from the secured position of the structural case 310.

Further referring to FIG. 2B, each rail holder 320 further includes a third hole 354 into which the bridge portion 366 is inserted. In some embodiments, the third hole 354 is elongated such that at least a portion of the bridge portion 366 is movable within the third hole 354. In some embodiments, the third hole 354 is a through-hole. The third hole 354 is positioned between the first hole 350 and the second hole 352.

Further referring to FIG. 2B, each rail holder 320 further includes a fourth hole 356 positioned between the first hole 350 and the third hole 354. In some embodiments, the fourth hole 356 is sized such that the finger end 362 fits in the fourth hole 356. In some embodiments, the finger end 362 cannot move within the fourth hole 356. In some embodiments, the first hole 350 and the fourth hole 356 have the same shape. In some embodiments, the first hole 350 and the fourth hole 356 have the same size. In some embodiments, the first hole 350 and the second hole 352 have different shapes and different sizes. In some embodiments, the second hole 352 and the third hole 354 have the same or similar shape.

In various embodiments, the finger end 362 is placed in the first hole 350 when no electrical component is received in the structural case 310, as shown in FIG. 2A. Now referring to FIGS. 3A-5, installation of the electrical component 400 into the structural case 310 will be described.

Referring to FIGS. 3A and 3B, when the electrical component 400 is inserted into the rail holders 320, an installation pressure is generated when the electrical component 400 being inserted contacts the finger end 362. In response to the installation pressure, the finger end 362 is released from the first hole 350 when the electrical component 400 is advanced towards the secured position.

Figure 4A:
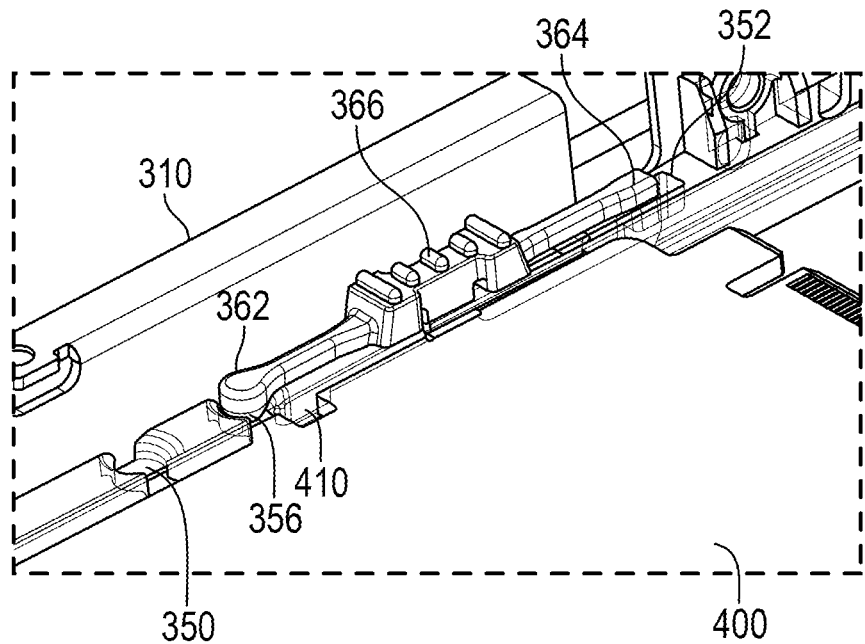
FIG. 4A is a magnified view of the assembly shown in FIG. 3A when the electrical component is advanced toward a secured position relative to the structural case, according to certain aspects of the present disclosure.
Figure 4B:
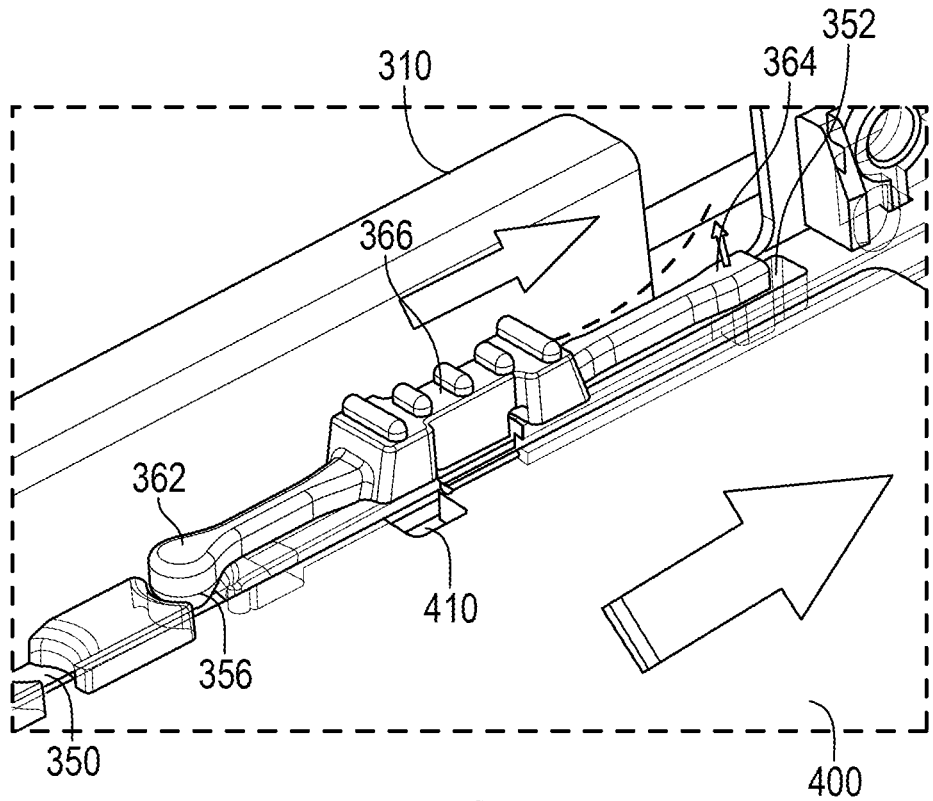
FIG. 4B is a magnified view of the assembly shown in FIG. 3A when the electrical component is advanced toward a secured position relative to the structural case, according to certain aspects of the present disclosure.

Referring to FIG. 4A, the released finger end 362 is subsequently inserted into the fourth hole 356 when the electrical component 400 is advanced towards the secured position. Referring to FIG. 4B, when the electrical component 400 is further advanced towards the secured position and contacts the hook end 364, the installation pressure causes the hook end 364 side of the latch 360 to deform. The hook end 364 is raised in response to the installation pressure. The second hole 352 is elongated such that the hook end 364 is movable within the second hole 352 in response to the installation pressure. In some embodiments, the hook end 364 moves from a first position to a second position within the second hole 352 in response to the installation pressure or when the electrical component 400 is advanced towards the secured position.

Figure 5:
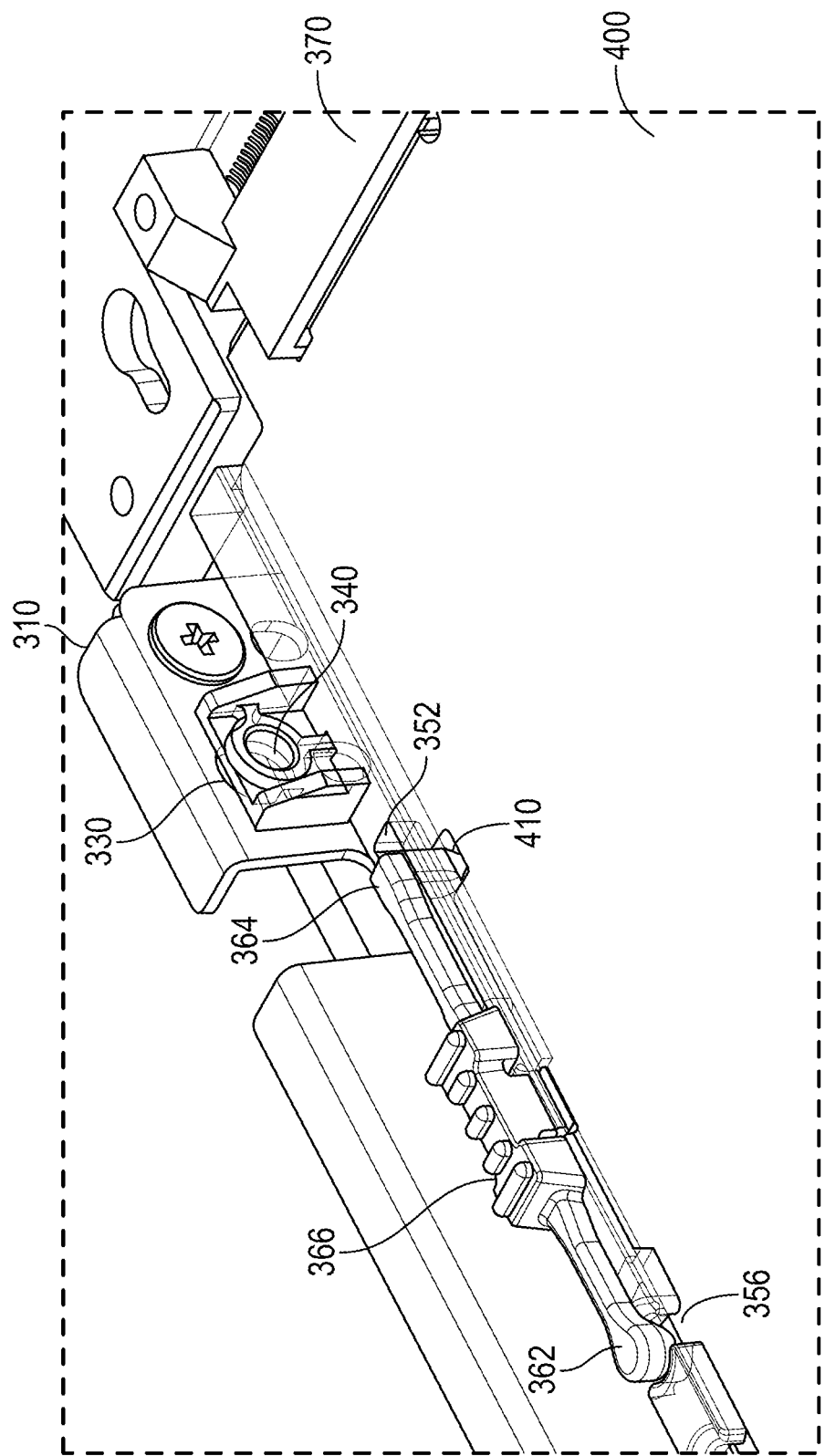
FIG. 5 is a magnified view of the assembly shown in FIG. 3A when the electrical component is in the secured position relative to the structural case, according to certain aspects of the present disclosure.

Referring to FIG. 5, at least a portion of the electrical component 400 at one side, which is perpendicular to opposite sides of the electrical component 400 inserted into the pair of rail holders 320, is inserted into a connector 370 at the structural case 310 when the electrical component 400 is in the secured position. Further, the hook end 364 is inserted into a hole 410 formed on the electrical component 400 to secure the electrical component 400 to the structural case 310 in response to the installation pressure or when the electrical component 400 reaches the secured position. Thus, the installed electrical component 400 is secured not only by the connector 370, but also by the hook end 364 inserted into the hole 410 of the electrical component 400. Therefore, contrary to the prior art assembly 100 discussed above, no additional fastening mechanisms such as the screw is required for securing the electrical component 400 to the structural case 310 in the assembly 300 according to various embodiments of the present invention. Therefore, no tool is necessary to secure the electrical component 400 to the structural case 310 of the assembly 300.

Furthermore, no tool is necessary to remove the installed electrical component 400 from the structural case 310 of the assembly 300. Now referring to FIGS. 6A-7D, disassembly of the electrical component 400 from the structural case 310 will be described.

Figures 6A, 6B:
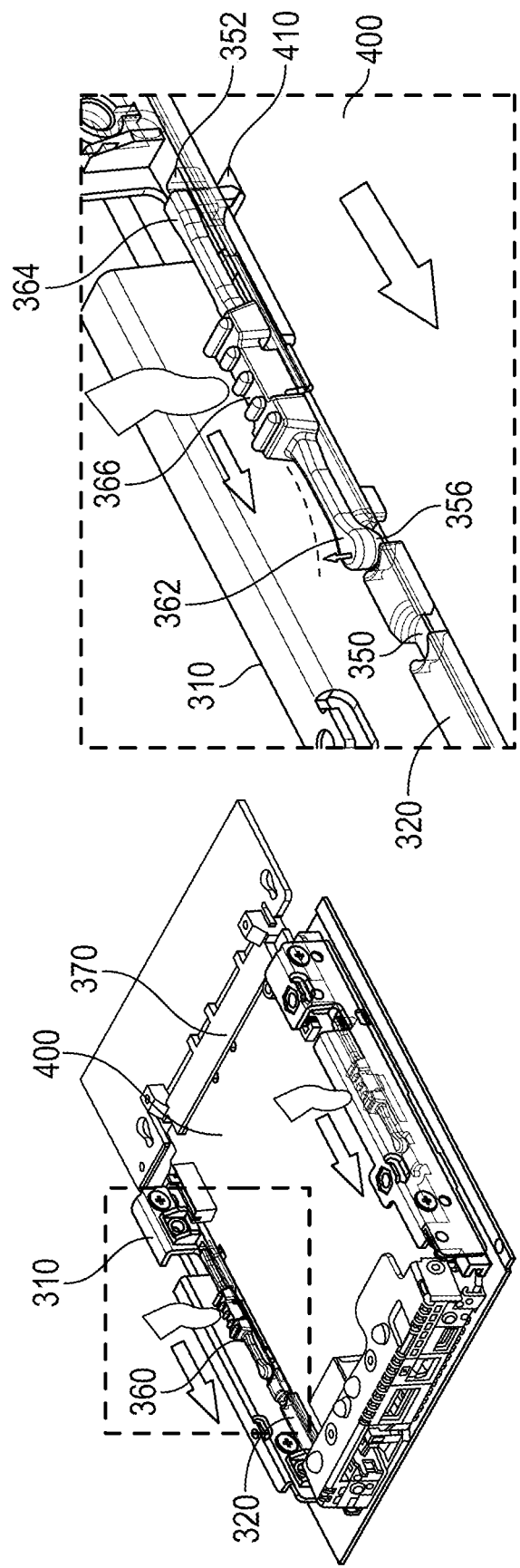
FIG. 6A is a perspective view of an assembly for securing an electrical component to a structural case for a server with the electrical component installed therein, according to certain aspects of the present disclosure.
FIG. 6B is a magnified view of a portion of the assembly shown in FIG. 6A, according to certain aspects of the present disclosure.

Referring to FIGS. 6A and 6B, a disassembly pressure needs to be generated to remove the installed electrical component 400 from the structural case 310. The disassembly pressure is caused by an operator, without use of tools. In particular, the operator presses the bridge portion 366 to generate the disassembly pressure. In some embodiments, both bridge portions 366 are pressed with fingers of the operator, as shown in FIG. 6A, to release the electrical component 400 from the structural case 310. As shown in FIG. 6B, the pressing of the bridge portion 366 or the disassembly pressure causes the finger end 362 side of the latch 360 to deform. In particular, the finger end 362 in the fourth hole 356 is raised in response to the disassembly pressure.

Figure 7B:
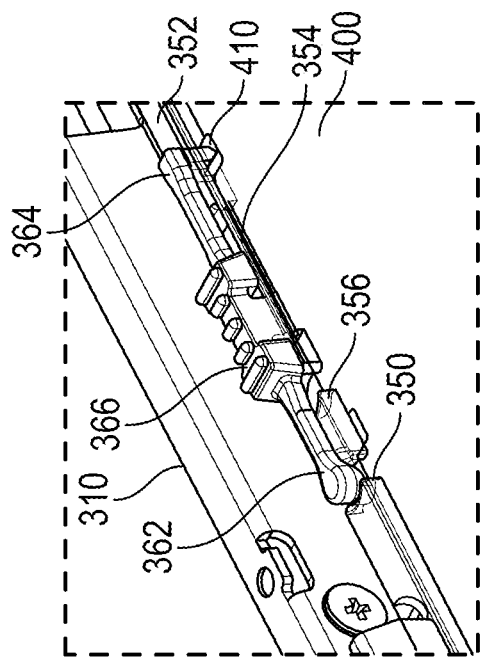
FIG. 7B is a magnified view of a portion of the assembly shown in FIG. 7A, according to certain aspects of the present disclosure.
Figure 7D:
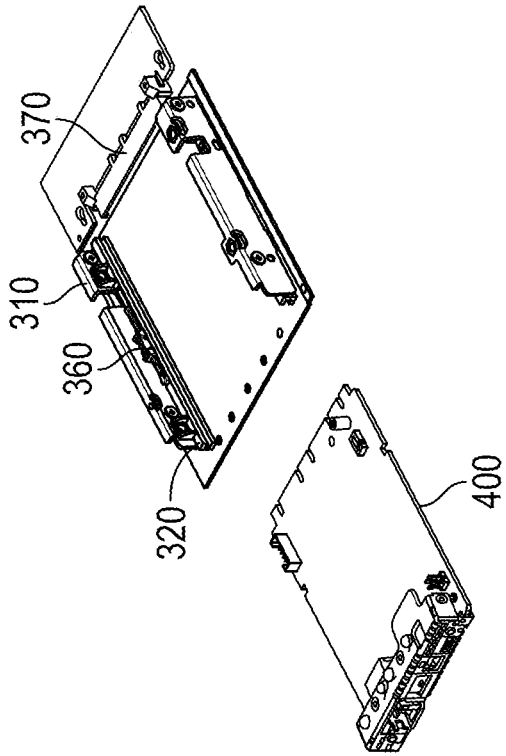
FIG. 7D is a perspective view of the assembly shown in FIG. 7A, the electrical component having been released from the structural case, according to certain aspects of the present disclosure.
Figure 7A:
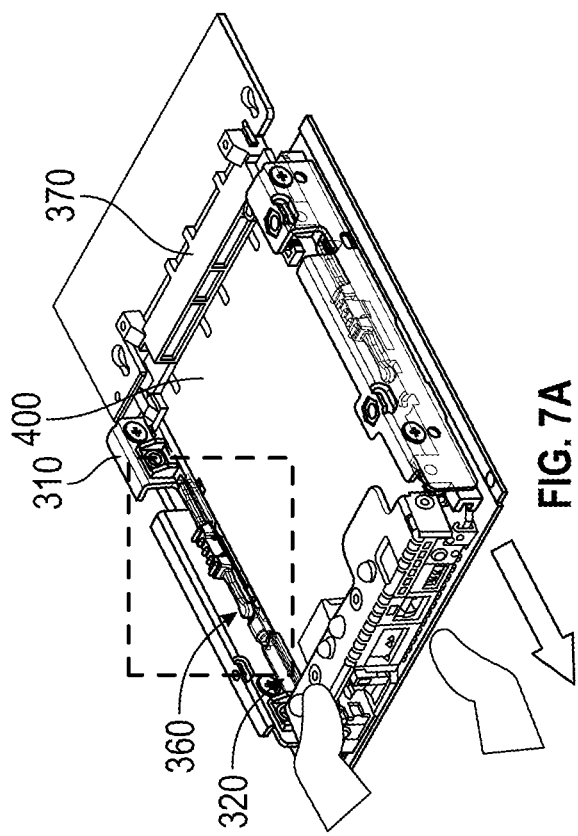
FIG. 7A is a perspective view of an assembly for securing an electrical component to a structural case for a server, the electrical component being released from the structural case, according to certain aspects of the present disclosure.
Figure 7C:
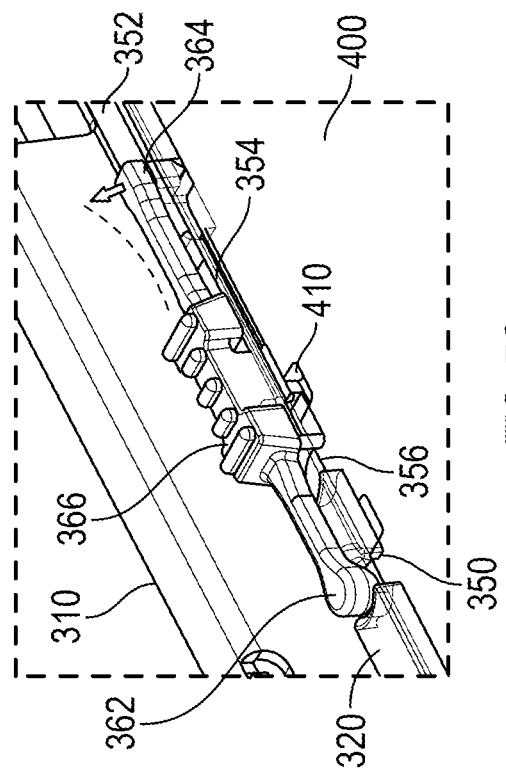
FIG. 7C is a magnified view of a portion of the assembly shown in FIG. 7A, according to certain aspects of the present disclosure.

Referring to FIG. 7A, the electrical component 400 is released from the connector 370 at the structural case 310 in response to the disassembly pressure generated by the pressing of the bridge portion 366. Further, the finger end 362 is released from the fourth hole 356 in response to the disassembly pressure or when the electrical component 400 is removed from the secured position. Furthermore, the released finger end 362 is inserted into the first hole 350 in response to the disassembly pressure or when the electrical component 400 is removed from the secured position and pulled out of the rail holders 320, as shown in FIG. 7B. Moreover, the hook end 364 is released from the hole 410 formed on the electrical component 400 when the electrical component 400 is removed from the secured position and pulled out of the rail holders 320. See FIGS. 7B and 7C. The released hook end 364 moves from the second position to the first position within the second hole 352 when the electrical component 400 is removed from the secured position and pulled out of the rail holders 320, as shown in FIG. 7C. FIG. 7D shows the electrical component 400 completely released from the assembly 300.

In summary, as shown in FIGS. 6A and 6B, the disassembly pressure caused by an operator pressing the bridge portion 366 releases the electrical component 400 from the connector 370 without requiring use of a tool or manually pulling the electrical component 400 by the operator. Once the electrical component 400 is released from the connector 370 and the finger end 362 is raised/released from the fourth hole 356, the electrical component 400 is pulled out by the operator, as shown in FIG. 7A-7D. Therefore, the disassembly of the electrical component 400 from the assembly 300 can be done quickly without requiring any tools.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the disclosure. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this disclosure belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. An assembly for securing an electrical component to a server, the assembly comprising:
   a structural case for a server, the case being configured to receive and secure in place an electrical component for the server;
   a pair of rail holders mounted to the structural case, respectively, near a respective case side of two opposing case sides, each rail holder of the pair of rail holders having a plurality of mounting holes that includes a first hole and a second hole; and
   a pair of latches, each latch of the pair of latches being movably mounted to a respective one of the pair of rail holders, each latch having a finger end that is coupled to a hook end via a bridge portion, the finger end and the hook end being inserted, respectively, into the first hole and the second hole of the respective one of the pair of rail holder,
   wherein the finger end and the hook end independently and flexibly move relative to the bridge portion in response to applied pressure, the applied pressure being
      an installation pressure caused by contact between the electrical component and, sequentially, the finger end and the hook end, the installation pressure being applied when the electrical component is advanced towards a secured position relative to the structural case, and
      a disassembly pressure caused by an operator, without use of tools, in response to pressing the bridge portion, the disassembly pressure being applied when the electrical component is removed from the secured position.

2. The assembly of claim 1, wherein each rail holder further includes a third hole into which the bridge portion is inserted.

3. The assembly of claim 2, wherein the third hole is positioned between the first hole and the second hole.

4. The assembly of claim 3, wherein each rail holder further includes a fourth hole positioned between the first hole and the third hole.

5. The assembly of claim 4, wherein the finger end is placed in the first hole when no electrical component is received in the structural case.

6. The assembly of claim 5, wherein the finger end is released from the first hole and subsequently inserted into the fourth hole in response to installation pressure or when the electrical component is advanced towards the secured position.

7. The assembly of claim 1, wherein the second hole is elongated such that the hook end is movable within the second hole in response to at least the installation pressure or disassembly pressure.

8. The assembly of claim 7, wherein the hook end moves from a first position to a second position within the second hole in response to the installation pressure or when the electrical component is advanced towards the secured position.

9. The assembly of claim 8, wherein at least a portion of the electrical component at one side, which is perpendicular to opposite sides of the electrical component inserted into the pair of rail holders, is inserted into a connector at the structural case when the electrical component is advanced to the secured position.

10. The assembly of claim 4, wherein the hook end is inserted into a hole formed on the electrical component to secure the electrical component to the structural case in response to the installation pressure or when the electrical component is advanced to the secured position.

11. The assembly of claim 10, wherein the finger end is released from the fourth hole in response to the disassembly pressure or when the electrical component is removed from the secured position.

12. The assembly of claim 11, wherein the released finger end is inserted into the first hole in response to the disassembly pressure or when the electrical component is removed from the secured position and pulled out of the rail holders.

13. The assembly of claim 12, wherein the hook end is released from the hole formed on the electrical component when the electrical component is removed from the secured position and pulled out of the rail holders.

14. The assembly of claim 13, wherein the hook end moves from a second position to a first position within the second hole when the electrical component is removed from the secured position and pulled out of the rail holders.

15. The assembly of claim 1, wherein the pair of latches is made of an elastic material comprising plastic, rubber, or hybrid material having elastic properties.

16. A server comprising:
a structural case configured to receive and secure in place an electrical component;
a pair of rail holders mounted to the structural case, respectively, near a respective case side of two opposing case sides, each rail holder of the pair of rail holders having a plurality of mounting holes that includes a first hole and a second hole; and
a pair of latches made of an elastic material comprising plastic, rubber, or hybrid material having elastic properties, each latch of the pair of latches being movably mounted to a respective one of the pair of rail holders, each latch having a finger end that is coupled to a hook end via a bridge portion, the finger end and the hook end being inserted, respectively, into the first hole and the second hole of the respective one of the pair of rail holder,
wherein the finger end and the hook end independently and flexibly move relative to the bridge portion in response to applied pressure, the applied pressure being
an installation pressure caused by contact between the electrical component and, sequentially, the finger end and the hook end, the installation pressure being applied when the electrical component is advanced towards a secured position relative to the structural case, and
a disassembly pressure caused by an operator, without use of tools, in response to pressing the bridge portion, the disassembly pressure being applied to remove the electrical component from the secured position.

17. The server of claim 16, wherein each rail holder further includes:
a third hole into which the bridge portion is inserted, the third hole being positioned between the first hole and the second hole; and
a fourth hole positioned between the first hole and the third hole.

18. The server of claim 17, wherein:
the finger end is placed in the first hole when no electrical component is received in the structural case;
the finger end is released from the first hole and subsequently inserted into the fourth hole in response to installation pressure or when the electrical component is advanced towards the secured position; and
the hook end moves from a first position to a second position within the second hole in response to the installation pressure or when the electrical component is advanced towards the secured position.

19. The server of claim 18, wherein:
at least a portion of the electrical component at one side, which is perpendicular to opposite sides of the electrical component inserted into the pair of rail holders, is inserted into a connector at the structural case when the electrical component is advanced to the secured position; and
the hook end is inserted into a hole formed on the electrical component to secure the electrical component to the structural case in response to the installation pressure or when the electrical component is advanced to the secured position.

20. The server of claim 19, wherein:
the finger end is released from the fourth hole in response to the disassembly pressure or when the electrical component is removed from the secured position;
the released finger end is inserted into the first hole in response to the disassembly pressure or when the electrical component is removed from the secured position and pulled out of the rail holders;
the hook end is released from the hole formed on the electrical component when the electrical component is removed from the secured position and pulled out of the rail holders; and
the hook end moves from the second position to the first position within the second hole when the electrical component is removed from the secured position and pulled out of the rail holders.

* * * * *